(12) United States Patent
Roblot et al.

(10) Patent No.: US 7,839,012 B2
(45) Date of Patent: Nov. 23, 2010

(54) POWER LINE TRANSMISSION

(75) Inventors: Sandrine Roblot, Rospez (FR); Christophe Roblot, Rospez (FR); Ahmed Zeddam, Perros-Guirec (FR)

(73) Assignee: France Telecom, Paris (FR)

( * ) Notice: Subject to any disclaimer, the term of this patent is extended or adjusted under 35 U.S.C. 154(b) by 229 days.

(21) Appl. No.: 12/252,637

(22) Filed: Oct. 16, 2008

(65) Prior Publication Data

US 2009/0128250 A1  May 21, 2009

(30) Foreign Application Priority Data

Oct. 16, 2007  (FR) .................................. 07 58365

(51) Int. Cl.
*H02J 3/34* (2006.01)

(52) U.S. Cl. ......................................................... 307/3

(58) Field of Classification Search ..................... 307/3; 340/310.11; 439/620.07, 620.09, 620.13
See application file for complete search history.

(56) References Cited

U.S. PATENT DOCUMENTS 3,846,638 A  11/1974  Wetherell ....................... 307/3
5,148,144 A *  9/1992  Sutterlin et al. ............. 455/402
5,949,327 A *  9/1999  Brown ......................... 375/258
7,050,016 B2 *  5/2006  Hibino et al. ................. 343/860
7,245,201 B1 *  7/2007  Kline et al. ............. 340/310.11
7,701,325 B2 *  4/2010  White, II ............... 340/310.11
2003/0095036 A1  5/2003  Wasaki et al. .......... 340/310.01

FOREIGN PATENT DOCUMENTS

GB           2154834 A      9/1985
WO         WO 96/07245      3/1996

OTHER PUBLICATIONS

French Search Report from counterpart foreign Application No. 07/58365.

* cited by examiner

*Primary Examiner*—Albert W Paladini
(74) *Attorney, Agent, or Firm*—David D. Brush; Westman, Champlin & Kelly, P.A.

(57) ABSTRACT

A device including an element for receiving an electrical signal comprising a high-frequency data signal component and a low-frequency power supply component. The electrical signal is conveyed in an electrical cable of an electrical installation. The device further includes impedance matching operative in a band of frequencies of the high-frequency signal component, the impedance matching being determined as a function of one or more characteristics of the electrical cable. Such a device can be integrated into a socket outlet or an electrical device or take the form of a socket adaptor.

8 Claims, 5 Drawing Sheets

POWER LINE TRANSMISSION

CROSS-REFERENCE TO RELATED APPLICATIONS

None.

STATEMENT REGARDING FEDERALLY SPONSORED RESEARCH OR DEVELOPMENT

None.

THE NAMES OF PARTIES TO A JOINT RESEARCH AGREEMENT

None.

FIELD OF THE DISCLOSURE

The field of the disclosure is that of power line transmission (PLT) of information.

The disclosure applies in particular, although not exclusively, to transmission of multimedia (voice and/or data) information at high bit rates via the electrical mains wiring in a home ("indoor" application of PLT systems).

BACKGROUND

The power line transmission technique uses an electrical power distribution network as a communication infrastructure to transport digital information. It superimposes on the low-frequency electrical current (typically 50 hertz (Hz) in Europe or 60 Hz in the United States) a low-energy signal at a higher frequency. This high-frequency signal propagates along the lines of an electrical installation (for example the electrical mains wiring of a home). When it is received by a PLT receiver (also known as a modem) of the electrical installation concerned, the analog signal can be decoded into a bit stream so that the data that it conveys can be reproduced on an appropriate device (for example a computer). This kind of modem also includes means for processing redundant information (error corrector code) that makes the signal more robust to noise and attenuation.

This technology can therefore be used to produce a computer network in a building (office block, school, etc.). This is referred to as an "indoor" application.

Power line transmission can be effected at a high or low bit rate. Power line transmission at high bit rates uses OFDM (Orthogonal Frequency Division Multiplexing) multicarrier modulation in a frequency band that generally extends from 1.6 megahertz (MHz) to 30 MHz. Power line transmission at low frequencies generally uses frequencies from 3 kilohertz (kHz) to 148 kHz.

The electrical mains wiring of a domestic (or more generally "indoor") installation constitutes a particularly difficult transmission medium for power line transmission. The inventors of this patent application have found that the transfer function of the transmission channel consisting of the electrical cable situated between two socket outlets of an electrical installation varies in a somewhat unpredictable manner. The transmission channel therefore has a phase and amplitude response that varies very considerably as a function of frequency. Measurements have demonstrated oscillations in amplitude response between 0 and −80 decibels (dB).

These strong variations of the transfer function of the transmission channel are caused in particular by the quasi-random behavior of the various loads on the electrical installation concerned, for example domestic appliances connected to the electrical mains wiring of the home. The response of the transmission channel is also variable over time, as a function of the operating status of those electrical appliances (in standby mode or operating), and even the presence or absence of the plug of an electrical appliance in a given socket outlet.

As a consequence of these strong variations of the transfer function of the transmission channel, certain frequency bands are subject to severe fading, varying in time, which means that it is not possible to guarantee error-free transmission of signals at high bit rates.

A number of techniques are known for compensating transmission problems caused by imperfections of the transfer function of a channel. These techniques are mostly digital techniques and generally rely on compensating losses caused by the imperfections of the transmission channel.

A first of these techniques uses spectrum spreading to transmit the signal over a frequency band wider than the set of frequencies that constitutes it, and thereby reduces the harmful effect of some transmission channel fading. At the receiver, the original signal is recovered by correlation. However, that spectrum spreading technique has the drawback that it is effective only for transmission at low bit rates, and can therefore not be applied to power line transmission of signals at high bit rates.

A second known technique applies equalization by means of a tuned filter to remove the amplitude and phase distortion caused by the channel. However, that equalization technique has the drawback that it is particularly complicated.

There is also known from the patent document WO 01/69812 "Powerline Communications system, Powerline Communication Transmission Network and Powerline Communication Device" a PLT communication device comprising an adaptive impedance, the value of which adapts automatically to changes in transmission conditions. That kind of adaptive impedance reduces the harmful effect of fading in a power line transmission channel, either by impedance conversion or by shifting such fading into frequency bands that are not used to transmit data.

A drawback of that technique is that it requires real-time evaluation of the transmission conditions on the electrical installation, in order to adapt the impedance of the device. That kind of evaluation is effected by software in the PLT modem. That kind of technique is corrective, and does not prevent the introduction of interference into the electrical installation.

Those methods all rely on digital processing of signals in the PLT modem and they therefore require software intervention at the modem level, which can be a problem with PLT modems already installed in an electrical installation, where updating the software may be difficult.

There is therefore a need for a technique that, instead of compensating losses caused by imperfections of the power line transmission channel in an electrical installation, prevents, or at least reduces, the occurrence of those imperfections. To be more precise, there is a need for a technique for preventing the connected status of the socket outlets (device operating, device on standby, no device) degrading the transmission characteristics of the channel consisting of the domestic electrical mains wiring.

SUMMARY OF THE INVENTION

An aspect of the disclosure relates to a device comprising means for receiving an electrical signal comprising one or more high-frequency data signal components and one or more low-frequency power supply components, the electrical signal being conveyed in a sheath comprising at least two electrical mains wiring conductors.

According to an aspect of the disclosure, this kind of device comprises impedance matching means operative in a band of frequencies of the high-frequency signal component and the impedance matching means are determined as a function of one or more characteristics of the conductors.

Note that the conductors can be molded into the sheath to form an electrical cable or not. Throughout the remainder of this document, generic references to an electrical cable cover both these possibilities.

An aspect of the disclosure is therefore based on a new and inventive approach to dealing with the problem of the strong variability of the transfer function of the transmission channel of a PLT system consisting of electrical mains wiring. Whereas all techniques known until now are based on compensating losses caused by the presence of frequency-dependent fading in this transfer function, an aspect of the disclosure proposes on the contrary to prevent the occurrence of such frequency-dependent fading.

To this end, an aspect of the disclosure is based on a physical approach to the problem, through impedance matching in the PLT signal frequency band to prevent reflection of the PLT signals. This impedance matching is characteristic of a type of electrical cable (to be more precise of the conductors that constitute it (for example live and neutral or live, neutral and ground conductors)), and so the same device can be used in any electrical installation using this type of cable. In contrast to the prior art methods, and in particular the technique of the document WO 01/69812, the technique according to an aspect of the disclosure takes no account of high-frequency signal transmission characteristics, and instead takes account of the characteristics of the electrical installation concerned.

In particular, account is taken of the "per unit length" parameters of the network cables, such as their inductance per unit length and capacitance per unit length.

The presence of the device, according to an aspect of the disclosure, in an electrical installation therefore prevents disturbance of the transfer function of the transmission channel linked to the presence or absence of certain electrical devices (hairdryer, modem, lamp, computer, etc.) in the socket outlets of the installation, and their operating state (operating or on standby). In other words, the device, according to an aspect of the disclosure, guarantees the stability of the PLT signal transmission channel and consequently prevents transmission errors and improves quality of service.

Implementing one or more aspects of the disclosure does not require any software intervention at the PLT modem, and these aspects can be used in conjunction with any other digital and/or software signal processing method.

In one embodiment, the impedance matching means comprise one or more passive components from the group comprising:
 a resistor;
 an inductor;
 a capacitor.

The device can therefore be produced in the form of a four-pole network based on R, L, C passive components. The values of those components are fixed and chosen as a function of the characteristics of the electrical cable used in the installation concerned. No software and/or automatic intervention is necessary to modify these values as a function of the current signal transmission conditions in the electrical mains wiring.

The sheath comprising three conductors referred to as the ground, live and neutral conductors, the impedance matching means advantageously comprise three resistors respectively intended to be connected:

between ground and neutral;
 between ground and live;
 between live and neutral.

Accordingly, for a 50 Hz electrical mains wiring installation conventionally including a ground wire, a live wire, and a neutral wire, for example, the impedance matching means can take the form of a π network for complete impedance matching of the transmission line.

For an installation comprising no ground wire, the same device can be used with the terminals of the resistors intended to be connected to it left "floating".

According to one advantageous feature, this kind of device includes at least two high-pass filters whose cut-off frequency is between the low frequency (i.e. the frequency of the electrical power supply, for example 50 Hz or 60 Hz) and the high frequency (i.e. the frequency of the PLT signals), and these high-pass filters are disposed on the upstream side and the downstream side of the impedance matching means.

These filters therefore block the low frequencies of the electrical power supply signal and this means that impedance matching is effected only for the frequencies used by the PLT system.

This proves particularly important in an aspect of the disclosure in which impedance matching is effected by means of resistors. At low frequencies (for example 50 Hz) the power consumption linked to the presence of a resistor between live and neutral could prove to be a problem because of:
 the heat given off ("radiator" effect);
 increased power consumption by the customer of the electrical installation;
 loss of energy, no longer available for electrical devices connected to the network;
 destruction of the device, caused by the resistors burning out.

These high-pass filters on either side of the impedance matching means block the low-frequency power supply signal at the input and the output of the device to prevent it passing through the matching means.

In one embodiment, the device also comprises means in parallel with said impedance matching means for transmitting said low-frequency signal component. For example, the device includes a low-pass filter for blocking the high-frequency PLT signal and allowing the low-frequency power supply current to pass directly to the output of the device with no impedance matching.

In one embodiment, this kind of device comprises first means for connection to a socket outlet providing access to the electrical installation and second means for connection to an electrical device adapted to be plugged into said socket outlet.

The device can therefore take the form of a socket adaptor, for example comprising, as the first connection means, a male plug (for example in the form of two pins) intended to be plugged into the electrical socket and, as the second connection means, a female socket (for example in the form of two receptacles) intended to receive the male pins of an electrical device (hairdryer, lamp, television, PLT modem, etc.) to be connected to the mains.

This matches the impedance of the socket outlets of the electrical installation concerned to prevent reflection of signals at the high-frequency PLT data transmission frequencies when they reach the socket. The impedance of a socket left open circuit or into which an electrical device is plugged is different from that of the electrical mains wiring. Reflection of the PLT signals is therefore to be avoided, and also reflection of high-frequency interference introduced into the installation by the electrical devices.

The device therefore constitutes an interface between the mains wiring and the electrical devices connected to it.

Another embodiment relates to an electrical mains wiring access socket (for example a socket outlet) comprising a device as described above.

Thus the device according to an aspect of the disclosure is integrated directly into the electrical installation access sockets. Its presence is therefore transparent for the user of the installation. Furthermore, this prevents interference conducted by electrical devices plugged into the mains from entering the mains wiring. All or only some of the electrical socket outlets of the installation concerned incorporating a device of the present disclosure can be envisaged.

A further embodiment, where appropriate complementary to the preceding embodiment, relates to a device comprising means for connection to electrical mains wiring that incorporates a device as described above. Thus the device is no longer disposed in the electrical socket outlets and no longer takes the form of an adaptor, but is incorporated directly into an electrical device that can be plugged into the mains. This can be a domestic appliance, such as a vacuum cleaner or hairdryer, or a communication device, and in particular a PLT modem.

An aspect of the disclosure relates finally to a power line data transmission system comprising electrical mains wiring including socket outlets adapted to cooperate with a device comprising means for connection to the mains wiring, a device for sending high-frequency data signals, and a device for receiving high-frequency data signals.

According to an aspect of the disclosure, in such systems, each electrical mains wiring access socket situated between the sending device and the receiving device includes a device as described above.

Thus each socket outlet of the electrical installation situated between the two PLT modems of the power line transmission system is equipped with a device according to an aspect of the disclosure. Such devices can be present at each socket outlet, either in the form of an adaptor or incorporated into the socket outlet or the electrical device connected to it.

Installing the device in all socket outlets situated between the sender and the receiver of high bit rate signals minimizes the risk of introducing interference into the electrical mains wiring used to transmit the PLT signals. Equipping all the socket outlets of the electrical installation with the device, and not only those situated between two modems, can also be envisaged, of course.

LIST OF FIGURES

Other advantages and features become more clearly apparent on reading the following description of one particular embodiment of the disclosure, given by way of illustrative and non-limiting example, and from the appended drawings, in which.

DETAILED DESCRIPTION OF ILLUSTRATIVE EMBODIMENTS

The general principle of an aspect of the disclosure is based on using a physical device in a power line transmission system to adapt at least some network terminations (i.e. at least some socket outlets) to the characteristic impedance of domestic electrical mains wiring to prevent some kinds of interference entering the mains wiring.

One particular embodiment is described below in the context of a home equipped with a power line transmission system.

Signal attenuation is a recurrent problem in power line transmission systems, even though the distances concerned are short (at most a few hundred meters). This stems in particular from the large number of branch connections, i.e. secondary branches connected to the main path, ending at an open circuit or at devices that do not have an impedance matching that of the line.

The propagation channel is therefore subject to very high attenuation in homes including a large number of electrical socket outlets.

What is more, using domestic appliances increases the noise level on the domestic electrical mains wiring according to their operating state (on/off). For example, for low-power lamps the variation in noise level can reach 30 dB.

Figure 1:
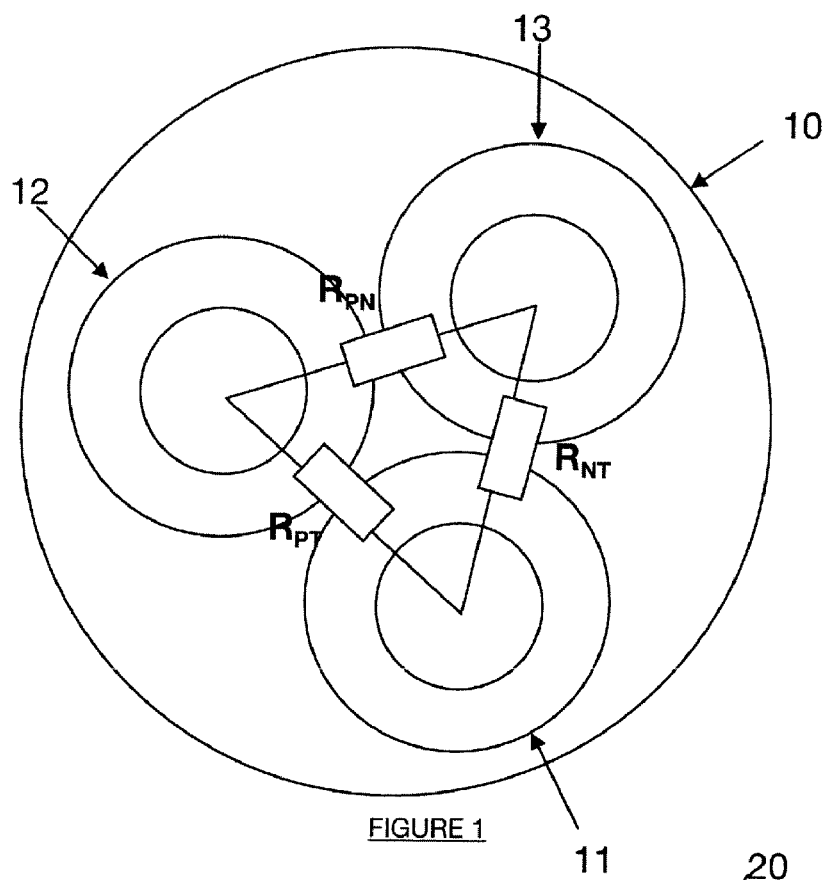
FIG. 1 shows an example of a device according to an aspect of the disclosure for an electrical cable comprising three conductors.

Thus connecting electrical devices causes large fluctuations in the transfer function of the power line transmission channel and significant fading at certain frequencies, depending on the type of equipment connected.

an aspect of the disclosure solves this problem by proposing a device, shown in a simplified form in FIG. 1, that prevents interference entering the electrical mains wiring.

Consider an electrical cable comprising a sheath 10 and three conductors, namely a ground wire 11, a live wire 12, and a neutral wire 13. The device, according to an aspect of the disclosure, takes the form of a π network comprising three resistors:

a resistor RPN connected between the live wire 12 and the neutral wire 13;

a resistor RNT connected between the ground wire 11 and the neutral wire 13;

a resistor $R_{PT}$ connected between the live wire 12 and the ground wire 11.

The values of the resistors $R_{PN}$, $R_{NT}$, $R_{PT}$ are determined as a function of the electrical characteristics of the conductors 11 to 13. They provide impedance matching for the transmission line consisting of the electrical cable 10 and thereby prevent reflection of high-frequency PLT signals.

Figure 2:
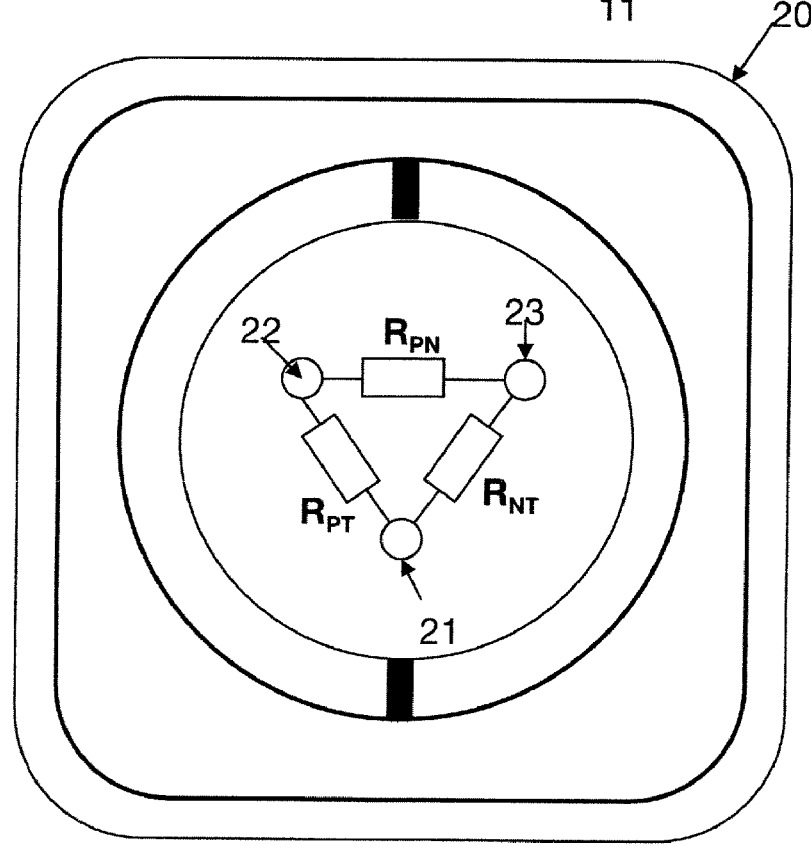
FIG. 2 shows the device from FIG. 1 integrated into an electrical installation access socket.

This device can be incorporated into an electrical socket outlet constituting a termination of the installation concerned, as shown in FIG. 2.

This kind of socket outlet 20 includes two orifices 22 and 23 respectively connected to the live wire 12 and the neutral wire 13 of the FIG. 1 electrical cable. These two orifices are intended to receive the pins of a male plug of an electrical device to be plugged into the mains.

The socket also includes a pin 21 connected to the FIG. 1 ground wire 11. This pin 21 is intended to cooperate with the female portion of a plug connected to an electrical device. It can be left "floating" for a device that does not need to be grounded (for example a lamp).

The resistors $R_{PN}$, $R_{NT}$, $R_{PT}$ are integrated into the socket outlet 20, behind the orifices 22 and 23 and the pin 21.

Figure 3:
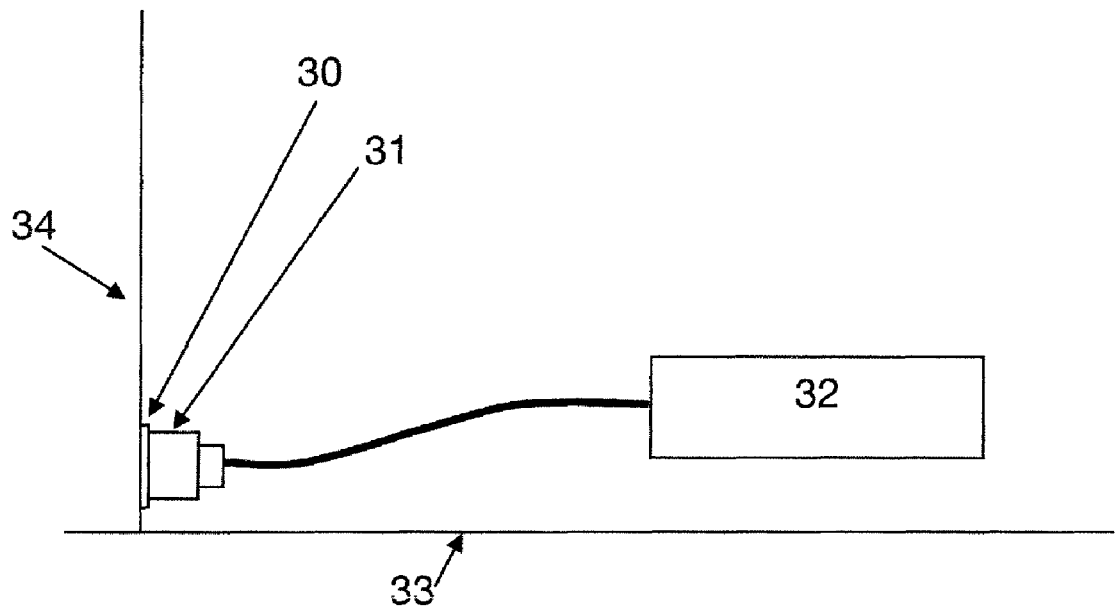
FIG. 3 shows the device from FIG. 1 in the form of a wall socket outlet adaptor.

The device from FIG. 1 can also take the form of a socket adaptor, as shown in FIG. 3. In a home with a floor 33, a socket outlet 30 is set into the wall 34. This embodiment of the device takes the form of a socket adaptor 31 that includes at least two male pins adapted to cooperate with the two orifices of a socket outlet 30 to connect the device to the electrical socket outlet and at least two female receptacles adapted to cooperate with the connecting pins of an electrical device 32 to be connected to the mains wiring.

To be more precise, the side of the adaptor 31 facing the socket outlet 30 comprises two male pins for connection to the live wire and the neutral wire of the socket outlet 30 and a female receptacle for connection to the ground pin of the socket outlet 30. On the electrical device 32 side, the adaptor comprises two female receptacles and male pin.

If the mains wiring includes no ground wire, the corresponding connector of the adaptor can be left "floating".

Figure 4:
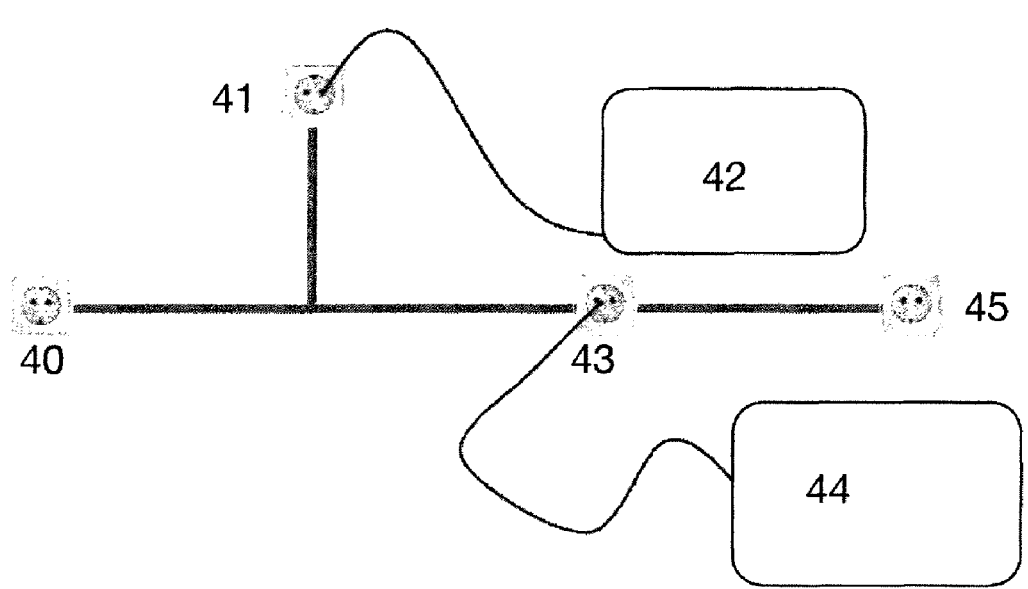
FIG. 4 shows an example of an electrical installation supporting a power line transmission system according to an aspect of the disclosure.

FIG. 4 shows an example of domestic electrical mains wiring providing the transmission medium for a power line transmission system. Here it is considered that only the portion of the mains wiring shown in FIG. 4 serves as a power line transmission medium, the rest of the mains wiring not being shown in FIG. 4.

A first socket outlet 40 constitutes the point of entry to the power line transmission system. A PLT modem for sending high-frequency signals, not shown in FIG. 4, is connected to this socket outlet 40. At the other end of the system, a socket outlet 45 constitutes the exit point of the PLT system and is intended to receive a second PLT modem, not shown in FIG. 4, for receiving a high-frequency signal.

Between the input socket outlet 40 and the output socket outlet 45, two socket outlets 41 and 43 are connected to respective electrical devices 42 and 44, for example a lamp and a television. As explained above, the transfer function of the FIG. 4 electrical mains wiring can be affected by interference, depending on the operating state of these devices.

To prevent the interference entering the mains wiring, a FIG. 1 type device is connected to each of the socket outlets 10, 41, 43, and 45. For example, this device can be integrated directly into the PLT modems plugged into the sockets 40 and 45, take the form of a socket adaptor plugged into the socket outlet 41 (see FIG. 3), or be integrated directly into the socket outlet 43 (see FIG. 2).

Matching the impedance at each of the FIG. 4 connections optimizes the stability of the transfer function of the PLT system transmission channel.

Figure 5:
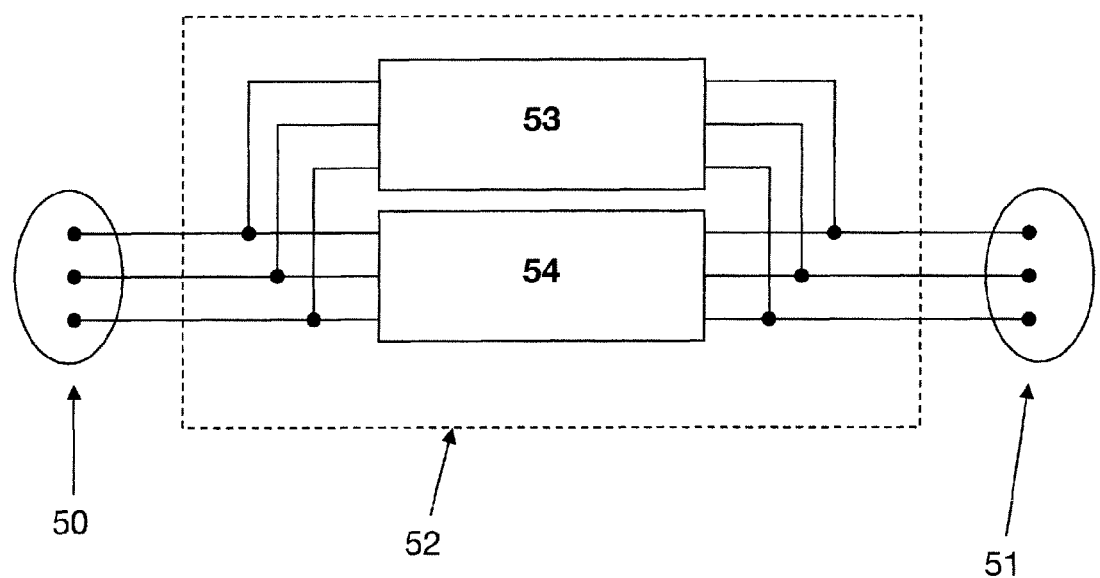
FIG. 5 is a functional diagram of a device according to an aspect of the disclosure.

A more detailed embodiment of the FIG. 1 device, shown in the form of a functional diagram in FIG. 5, is described below.

The context is 50 Hz domestic electrical mains wiring.

Using only the resistors $R_{PN}$, $R_{NT}$, $R_{PT}$ to provide impedance matching can prove a problem at 50 Hz.

If the resistors $R_{PN}$ and $R_{PT}$ are not of the same value, an electrical current can flow between neutral and ground and trip a differential circuit-breaker.

Furthermore, for a value of the resistor RPN of the order of about 140 ohms ($\Omega$) the energy consumption at 50 Hz becomes very high (approximately 345.7 watts (W)). In addition to the resulting "radiator" effect and the additional power consumption, the resistance itself can be severely damaged, this type of resistance generally being designed to withstand a maximum power of approximately 1 W. Moreover, this lost energy will no longer be available for electrical devices to be connected to the network.

An improved embodiment of the FIG. 5 device is therefore designed to effect impedance matching only at the frequencies used in PLT systems.

To this end, it takes the form of an interface 52 between a wall-mounted or floor-mounted electrical socket outlet 50 and an electrical device intended to be plugged into a socket outlet 51. This socket outlet 51 is the electrical socket outlet seen by the user, for connecting 50 Hz mains-powered devices or PLT communication equipment needing to receive an electrical power supply at 50 Hz and an appropriate high-frequency signal in a frequency band extending substantially from 1.6 MHz to 30 MHz (for simplicity, this embodiment is restricted to power line transmission at high bit rates, although aspects of the disclosure are equally applicable to power line transmission at low bit rates). The socket outlet 51 is part of the device, according to an aspect of the disclosure.

The interface 52 comprises:

impedance matching means 53 operative in the frequency band of the high-frequency signals, for example above 1 MHz;

means 54 enabling direct passage of 50 Hz through the device without impedance matching.

Thus electrical devices (for example domestic appliances) that need to receive the 50 Hz power supply component are not affected by the presence of the impedance matching means 53. The PLT communication devices that need to receive the 50 Hz power supply component and the high-frequency PLT signal benefit with advantage from the presence of the impedance matching means 53.

Figure 6A:
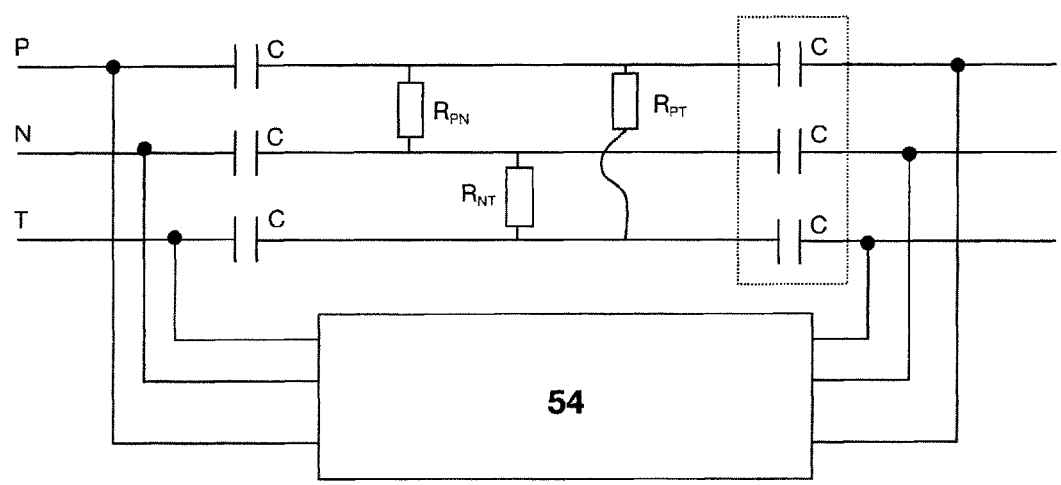
FIGS. 6A and 6B illustrate a first embodiment of the device from FIG. 5.
Figure 6B:
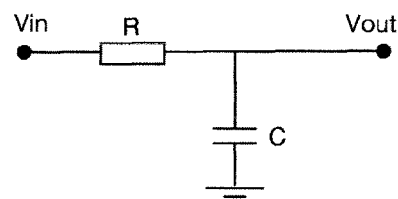

FIGS. 6A and 6B show one practical embodiment of the means 53 and 54.

Consider the three conductors P, N, and T respectively corresponding to the live, neutral and ground wires. The impedance matching means 53 comprise six capacitors C and three resistors $R_{PN}$, $R_{NT}$, $R_{PT}$. For example: $R_{PN}$=140$\Omega$, $R_{PT}$=120$\Omega$, $R_{NT}$=120$\Omega$.

When determining the values of these resistors $R_{PN}$, $R_{NT}$, $R_{PT}$, account is taken of the "per unit length" parameters of the cables of the installation. The parameters specified for the embodiment shown here were measured on a 3G2.5 type electrical cable. The code 3G2.5 denotes an electrical cable consisting of three wires each having a section of 2.5 square millimeters (mm$^2$) wires. The letter G indicates that the electrical cable also includes a protection conductor, generally green/yellow. This designation is standardized by CENELEC, the European Committee for Electrotechnical Standardization. To be more precise, the electrical cable considered in the embodiment described here is an H07RN-F 3G2.5 cable, which is used in industry to connect equipment.

The values of the inductance per unit length L (in microhenries per meter ($\mu$H/m) and the capacitance per unit length C (in picofarads per meter (pF/m)) of the electrical cable are given below, in matrix form:

$$[L] = \begin{pmatrix} 1.6473 & 1.4244 & 1.4276 \\ 1.4244 & 1.6512 & 1.4165 \\ 1.4276 & 1.4165 & 1.6512 \end{pmatrix}$$

-continued $$[C] = \begin{pmatrix} 80.3732 & -37.4014 & -37.4014 \\ -37.4014 & 81.1690 & -38.9930 \\ -37.4014 & -38.9930 & 80.3732 \end{pmatrix}$$

Note that the above matrices [L] and [C] are 3×3 matrices because the medium considered consists of three conductors (live, neutral and ground). The elements on the diagonal correspond to the self-inductance and self-capacitance of the conductors and the terms off the diagonal correspond to the mutual inductance and the mutual capacitance between the conductors. It is therefore clear that these matrices are symmetrical.

The per unit length parameters, usually called the RLCG parameters, electrically characterize the propagation medium:

the parameter R ohms per meter (Ω/m) represents losses caused by heat dissipated in the conductors;

the parameter L henries per meter (H/m) represents the magnetic flux between the conductors;

the parameter C farads per meter (F/m) represents the capacitance between the dielectric and the conductors; and the parameter G siemens per meter (S/m) represents losses in the dielectric.

The parameters L and C can be measured on a dedicated measurement bench. The losses R are measured by measuring the attenuation suffered by the signals during transmission. The parameter G is operative only with constant losses.

As a general rule, losses are frequency-dependent. Four parameters must then be measured to characterize the losses R:

$$R(f) = 4\sqrt{R_0 + a \cdot f^2 + b \cdot f^4 + c \cdot f^6}$$

With the 3G2.5 cable considered here, these quantities have the following values:

$R_0 = 10 \cdot 10^{-3}$ $a = 3.8 \cdot 10^{-17}$ $b = 5.22 \cdot 10^{-31}$ $c = 4.77 \cdot 10^{-47}$ The propagation medium in question is completely characterized if the per unit length parameters L, C and the losses R(f) are known.

These values are specific to one type of cable, and have to conform to a template set for the manufacturer. They can therefore be considered generic throughout the range of 3G2.5 cables.

This data is then processed digitally, using transmission line theory, by the following succession of steps:

from the matrices [L] and [C], the characteristic impedance matrix $[Z_c]$ of the electrical cable is calculated:

$$[Z_C] = \begin{pmatrix} 350.3 & 307.9 & 309.3 \\ 307.9 & 352.7 & 309.6 \\ 309.3 & 309.6 & 355.1 \end{pmatrix}$$

by matrix inversion, the equivalent components of the π network are determined for a line with three conductors (because these are 3×3 matrices) above a reference plane:

Z1=906.3Ω

Z2=963.5 Ω

Z3=105.3Ω

Z12=137Ω

Z13=135Ω

Z23=140.4 Ω here, since the ground conductor is the reference, the network can be simplified; the following values are obtained: $R_{PN}$=140.4Ω, $R_{NT}$=119.6Ω, $R_{PT}$=122.6Ω, and are simplified as follows: $R_{PN}$=140Ω, $R_{NT}$=120Ω, $R_{PT}$=120 Ω.

Figure 7:
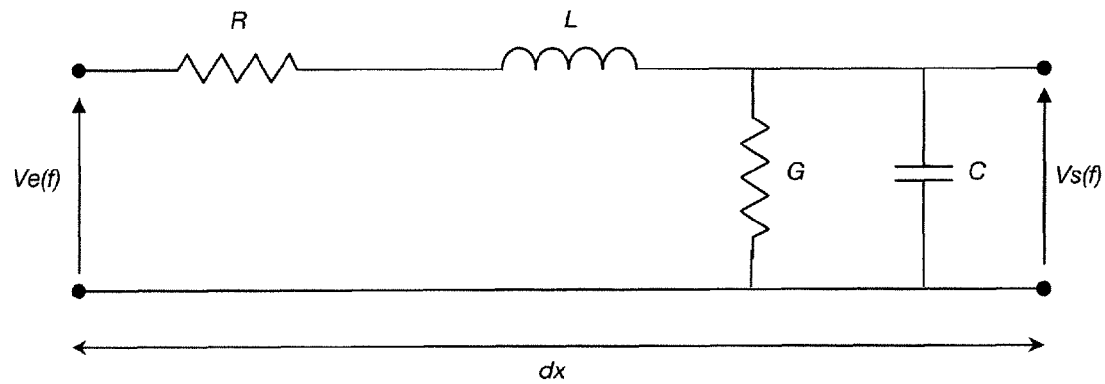
FIG. 7 shows, in the context of an outline of transmission line theory, an infinitesimally small element of a line comprising one conductor above a ground plane.

Referring to FIG. 7, according to transmission line theory, an infinitesimal line section of length dx is characterized by a four-pole network made up of a resistance per unit length R, an inductance per unit length L, a conductance per unit length G, and a capacitance per unit length C.

The four components, referred to as primary parameters or RLCG parameters, are generally frequency-dependent but are independent of position for homogeneous lines. This kind of four-pole network has an input voltage Vi(f) and an output voltage Vo(f).

In FIGS. 6A and 6B, the combination of the capacitor C and the resistor R constitutes a high-pass filter with a cut-off frequency $$f_c = \frac{1}{2\pi RC}.$$

The value of the capacitance C determines the cut-off frequency of the filter. For example, given the resistance values chosen, for C=10 nanofarads (nF), the cut-off frequency is approximately 100 kHz, and for C=100 nF, cut-off occurs at around 10 kHz.

The capacitors on the upstream side of the resistors (to the left of the resistors in FIG. 6A) form, with the resistors, first high-pass filters for selecting in the electrical signal reaching the socket outlet 50 via the electrical mains wiring the high-frequency component to be fed to the impedance matching means 53.

The capacitors downstream of the resistors (to the right of the resistors in FIG. 6A) form, with the resistors, second high-pass filters for preventing a 50 Hz component coming from the electrical device connected to the socket outlet 51 appearing in the impedance matching means 53.

Note that the choice of the components to use must also take account of their insulation voltage. Thus in the context of the present disclosure an insulation voltage of 400 volts (V) is suitable for the capacitors C. The dielectric of a capacitor cannot withstand an infinite voltage. The maximum insulation voltage is a function of the insulation chosen and the thickness of the dielectric. Above this voltage the dielectric may be pierced and the capacitor flash over.

The block 54 is a low-pass filter to allow the 50 Hz component to pass through the device of the disclosure without undergoing impedance matching. FIG. 6B shows one embodiment of this low-pass filter, in the form of a resistor R and a capacitor C, the cut-off frequency of which has the value $$f_c = \frac{1}{2\pi RC}.$$

Appropriate values of R and C must be determined to allow efficient selection of the 50 Hz component and not to induce excessive power consumption.

To reduce the power consumption of this kind of low-pass filter, the filter must have a low resistance. In one particular embodiment, using only a capacitor C can even be envisaged.

The value of the capacitor is then conditioned by the value of the cut-off frequency. For $f_c$=100 kHz, a capacitance of 1.6 microfarads (μF) is obtained. Moreover, the lower $f_c$, the higher the capacitance, and the larger the component. For example, a 400 V, 1 μF capacitor has a diameter of 1 centimeter (cm) and a length of 3 cm to 4 cm.

Figure 8:
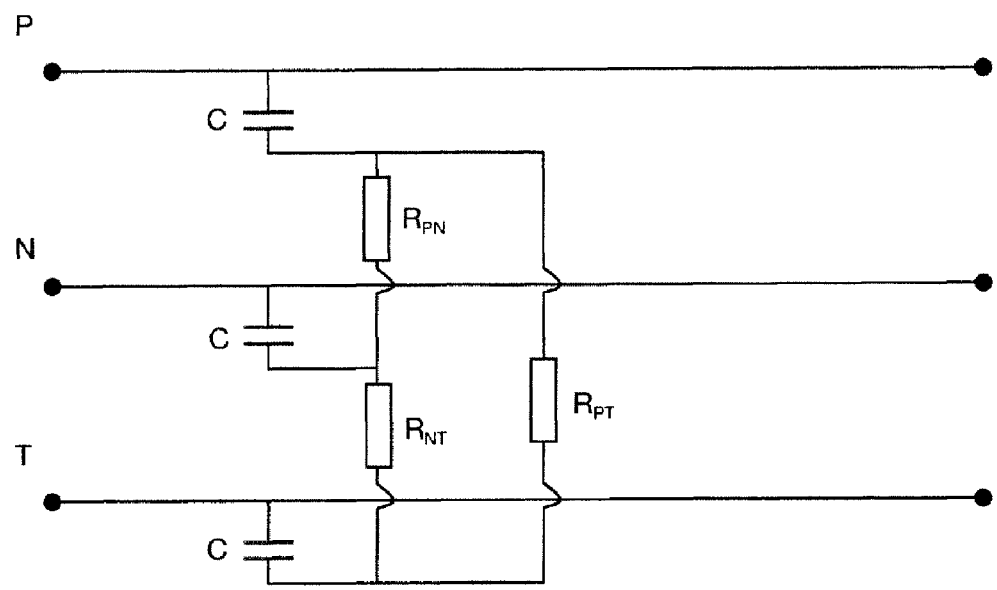
FIG. 8 shows a second embodiment of the device from FIG. 5.
Figure 9:
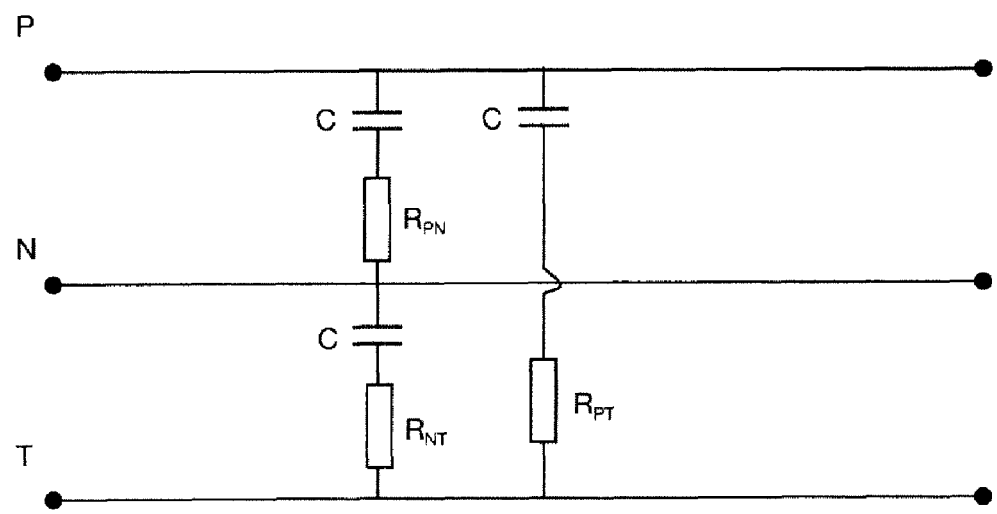
FIG. 9 shows a third embodiment of the device from FIG. 5.

FIGS. 8 and 9 show two other embodiments of the device of the disclosure.

In FIG. 8, three capacitors C connected to the live wire P, neutral wire N and ground wire T prevent the 50 Hz signal component reaching the π network formed by the resistors $R_{PN}$, $R_{NT}$, $R_{PT}$. These capacitors behave as a closed circuit at the high frequencies of the PLT signals and as an open circuit at the low frequency of the 50 Hz power supply component. The 50 Hz power supply component therefore passes directly to the output of the device, whereas the high-frequency PLT signal component flows through the capacitors C and undergoes impedance matching by the network of resistors $R_{PN}$, $R_{NT}$, $R_{PT}$.

The FIG. 9 embodiment constitutes an almost equivalent solution in which impedance matching is effected by means of a π network, each of the three branches of which consists of a resistor and a capacitor connected in series.

Choosing a capacitance value C=10 nF, and with $R_{PN}$=140Ω, $R_{PT}$=120Ω, $R_{NT}$=120Ω, the behavior of the system is as follows:

- at low frequencies, the 10 nF capacitor blocks AC; the 50 Hz component therefore passes directly through the device, via the conductors P, N, and T, without passing through the impedance matching network;
- at 1 MHz, the contribution of the capacitor in terms of impedance is of the order 1 milliohm (mΩ), which proves negligible compared to the 120 or 140Ω of the resistors $R_{PN}$, $R_{NT}$, $R_{PT}$;
- at 10 MHz, this contribution is approximately 10 mΩ;
- at 100 MHz, this contribution is approximately 100 mΩ.

In the FIG. 9 embodiment, impedance matching is therefore effected at the high frequencies of the PLT signals, without disturbance by the impedance of the capacitor C.

An aspect of the disclosure finds applications in any PLT system, at high or low bit rates. Note, however, that the quality of service problem proves more critical in high bit rate transmission systems.

Thus if the PLT system is used to transmit pictures or videos, an aspect of the disclosure circumvents problems of picture freezing and pixelation caused by the imperfections of the transmission channel (for example on plugging in a device or switching to standby a device plugged into one of the socket outlets of the electrical installation). An aspect of the disclosure also increases the guaranteed minimum bit rate in a PLT system.

Although the present disclosure has been described with reference to one or more examples, workers skilled in the art will recognize that changes may be made in form and detail without departing from the scope of the disclosure and/or the appended claims.

What is claimed is:

1. A device comprising:
    means for receiving an electrical signal comprising a high-frequency data signal component and a low-frequency power supply component, said electrical signal being conveyed in a sheath comprising at least two electrical mains wiring conductors;
    impedance matching means operative in a band of frequencies of said high-frequency signal component, said impedance matching means being determined as a function of one or more characteristics of said conductors, and wherein it comprises at least two high-pass filters, respectively disposed on the upstream side and the downstream side of said matching means and having a cut-off frequency that is substantially between said low frequency and said high frequency.

2. The device according to claim 1, wherein said impedance matching means comprise one or more passive components from the group comprising:
    a resistor;
    an inductor;
    a capacitor.

3. The device according to claim 1, wherein said sheath comprises three conductors referred to as a ground conductor, a live conductor and a neutral conductor, said impedance matching means comprise three resistors respectively intended to be connected:
    between the ground and neutral conductors;
    between the ground and live conductors;
    between the live and neutral conductors.

4. The device according to claim 1, also comprising means in parallel with said impedance matching means for transmitting said low-frequency signal component.

5. The device according to claim 1, comprising first means for connection to a socket outlet and second means for connection to an electrical device adapted to be plugged into said socket outlet.

6. An electrical mains wiring access socket outlet, comprising a device, wherein the device comprises:
    means for receiving an electrical signal comprising a high-frequency data signal component and a low-frequency power supply component, said electrical signal being conveyed in a sheath comprising at least two electrical mains wiring conductors;
    impedance matching means operative in a band of frequencies of said high-frequency signal component, said impedance matching means being determined as a function of one or more characteristics of said conductors, and wherein it comprises at least two high-pass filters, respectively disposed on the upstream side and the downstream side of said matching means and having a cut-off frequency that is substantially between said low frequency and said high frequency.

7. Equipment comprising means for connection to an electrical mains wiring, the equipment including a device comprising:
    means for receiving an electrical signal comprising a high-frequency data signal component and a low-frequency power supply component, said electrical signal being conveyed in a sheath comprising at least two electrical mains wiring conductors;
    impedance matching means operative in a band of frequencies of said high-frequency signal component, said impedance matching means being determined as a function of one or more characteristics of said conductors, and wherein it comprises at least two high-pass filters, respectively disposed on the upstream side and the downstream side of said matching means and having a cut-off frequency that is substantially between said low frequency and said high frequency.

8. A power line data transmission system, comprising electrical mains wiring including access socket outlets adapted to cooperate with equipment including means for connection to said network, a high-frequency data signal sender, and a high-frequency data signal receiver, wherein each electrical mains wiring access socket outlet situated between said sender and said receiver includes a device comprising:

means for receiving an electrical signal comprising a high-frequency data signal component and a low-frequency power supply component, said electrical signal being conveyed in a sheath comprising at least two electrical mains wiring conductors;

impedance matching means operative in a band of frequencies of said high-frequency signal component, said impedance matching means being determined as a function of one or more characteristics of said conductors, and wherein it comprises at least two high-pass filters, respectively disposed on the upstream side and the downstream side of said matching means and having a cut-off frequency that is substantially between said low frequency and said high frequency.

\* \* \* \* \*